United States Patent
Ota et al.

(10) Patent No.: US 11,333,986 B2
(45) Date of Patent: May 17, 2022

(54) DETECTION APPARATUS, EXPOSURE APPARATUS, AND ARTICLE MANUFACTURING METHOD

(71) Applicant: CANON KABUSHIKI KAISHA, Tokyo (JP)

(72) Inventors: Kazuki Ota, Tochigi (JP); Hironori Maeda, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/194,877

(22) Filed: Mar. 8, 2021

(65) Prior Publication Data

US 2021/0286275 A1  Sep. 16, 2021

(30) Foreign Application Priority Data

Mar. 12, 2020 (JP) .............................. JP2020-043337

(51) Int. Cl.
*G03F 9/00* (2006.01)
*G03F 7/20* (2006.01)

(52) U.S. Cl.
CPC ........ *G03F 9/7088* (2013.01); *G03F 7/70758* (2013.01)

(58) Field of Classification Search
CPC .... G03F 9/7088; G03F 9/7026; G03F 9/7011; G03F 7/70758
See application file for complete search history.

(56) References Cited

U.S. PATENT DOCUMENTS

| | | | |
|---|---|---|---|
| 5,648,854 A | 7/1997 | McCoy | |
| 2010/0097595 A1* | 4/2010 | Sato | G03F 9/7076 |
| | | | 355/72 |
| 2016/0370716 A1 | 12/2016 | Lof | |
| 2017/0351173 A1 | 12/2017 | Funabashi | |
| 2019/0219936 A1* | 7/2019 | Bijnen | G03F 9/7049 |

FOREIGN PATENT DOCUMENTS

| | | |
|---|---|---|
| EP | 2722714 A2 | 4/2014 |
| JP | 04268746 A | 9/1992 |
| JP | 2009129945 A | 6/2009 |
| JP | 1343640 B2 | 10/2009 |

OTHER PUBLICATIONS

Extended European Search Report issued in European Appln. No. 21160628.0 dated Aug. 6, 2021.

* cited by examiner

*Primary Examiner* — Peter B Kim
(74) *Attorney, Agent, or Firm* — Rossi, Kimms & McDowell LLP (57) ABSTRACT

A detection apparatus detects an orientation reference of an object to be detected which includes an edge including the orientation reference. The apparatus includes a first detection system configured to detect the edge such that the orientation reference is detected, and a second detection system configured to detect, by projecting a pattern to a surface of the object and detecting an image formed by reflected light from the surface, a position of the surface in a direction perpendicular to the surface. After a focusing operation of the first detection system is performed based on the position of the surface detected by the second detection system, the first detection system detects the orientation reference.

19 Claims, 12 Drawing Sheets

DETECTION APPARATUS, EXPOSURE APPARATUS, AND ARTICLE MANUFACTURING METHOD

BACKGROUND OF THE INVENTION

Field of the Invention

The present invention relates to a detection apparatus, an exposure apparatus, and an article manufacturing method.

Description of the Related Art

In the manufacture of various devices or articles such as a memory device, a logic device, an image sensor, a light emitting diode (LED), a laser diode, and a MEMS, an exposure apparatus for forming a pattern on a substrate can be used. The substrate is not limited to an opaque substrate such as a silicon substrate, and a transparent substrate can also be used. When a pattern in the first layer is formed, in order to form the pattern such that the pattern is aligned with the direction of the crystal lattice of the substrate, it is required to detect, with high accuracy, the orientation reference (orientation flat, notch, or the like) that indicates the orientation of the crystal lattice. Since it is difficult to detect the edge or orientation reference of a transparent substrate, a metal film can be deposited on the transparent substrate or a chamfer can be provided in the transparent substrate. In both an opaque substrate and a transparent substrate, in order to form a pattern aligned with the direction of the crystal orientation, it is important to detect the orientation reference with high accuracy.

SUMMARY OF THE INVENTION

The present invention provides a technique advantageous in detecting an orientation reference with high accuracy.

One of aspects of the present invention provides a detection apparatus that detects an orientation reference of an object to be detected which includes an edge including the orientation reference, the apparatus comprising: a first detection system configured to detect the edge such that the orientation reference is detected; and a second detection system configured to detect, by projecting a pattern to a surface of the object and detecting an image formed by reflected light from the surface, a position of the surface in a direction perpendicular to the surface, wherein after a focusing operation of the first detection system is performed based on the position of the surface detected by the second detection system, the first detection system detects the orientation reference.

Further features of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate.

Furthermore, in the attached drawings, the same reference numerals are given to the same or similar configurations, and redundant description thereof is omitted.

Figure 1:
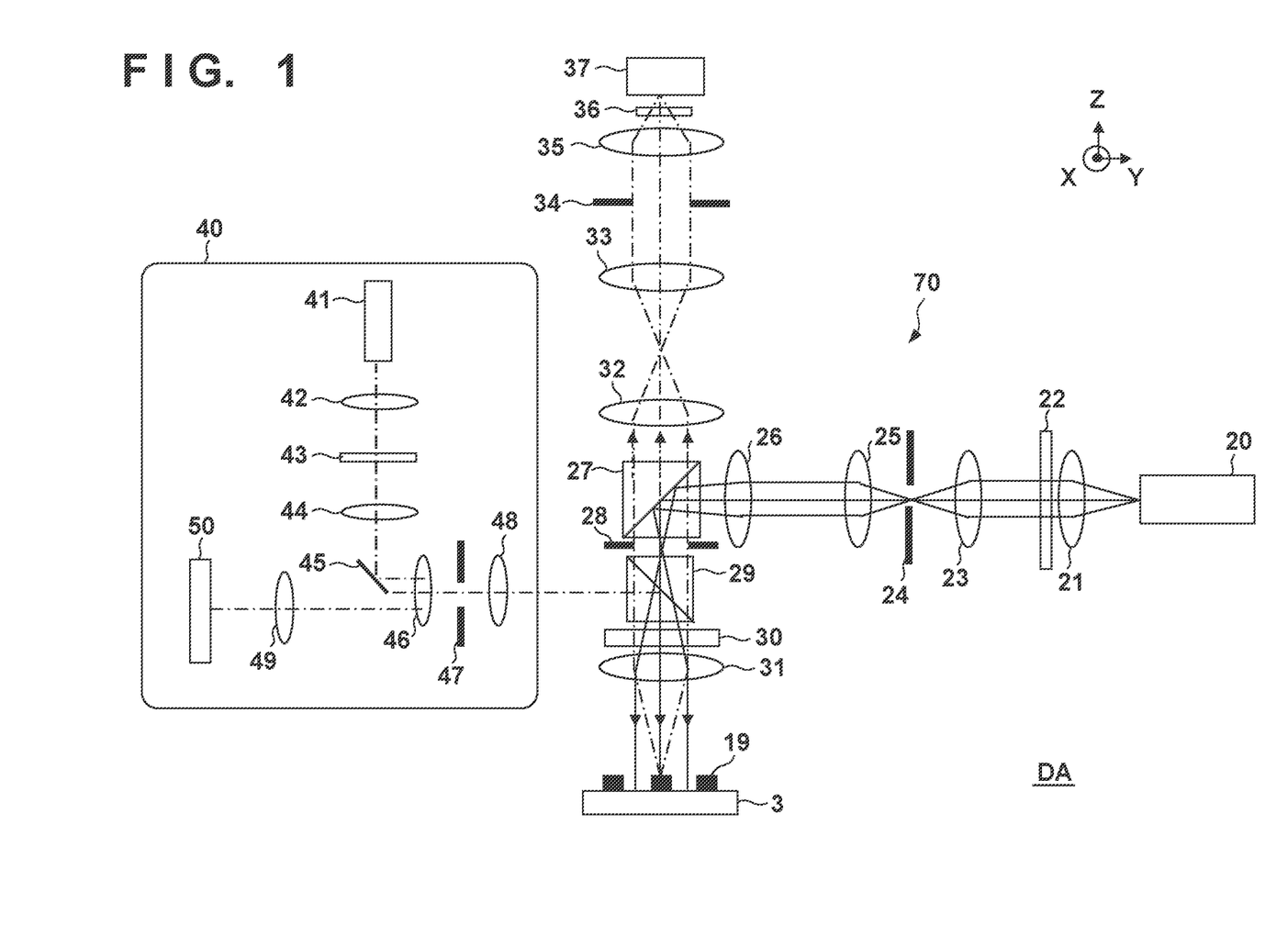
FIG. 1 is a view showing the arrangement of a detection apparatus according to an embodiment.
Figure 2:
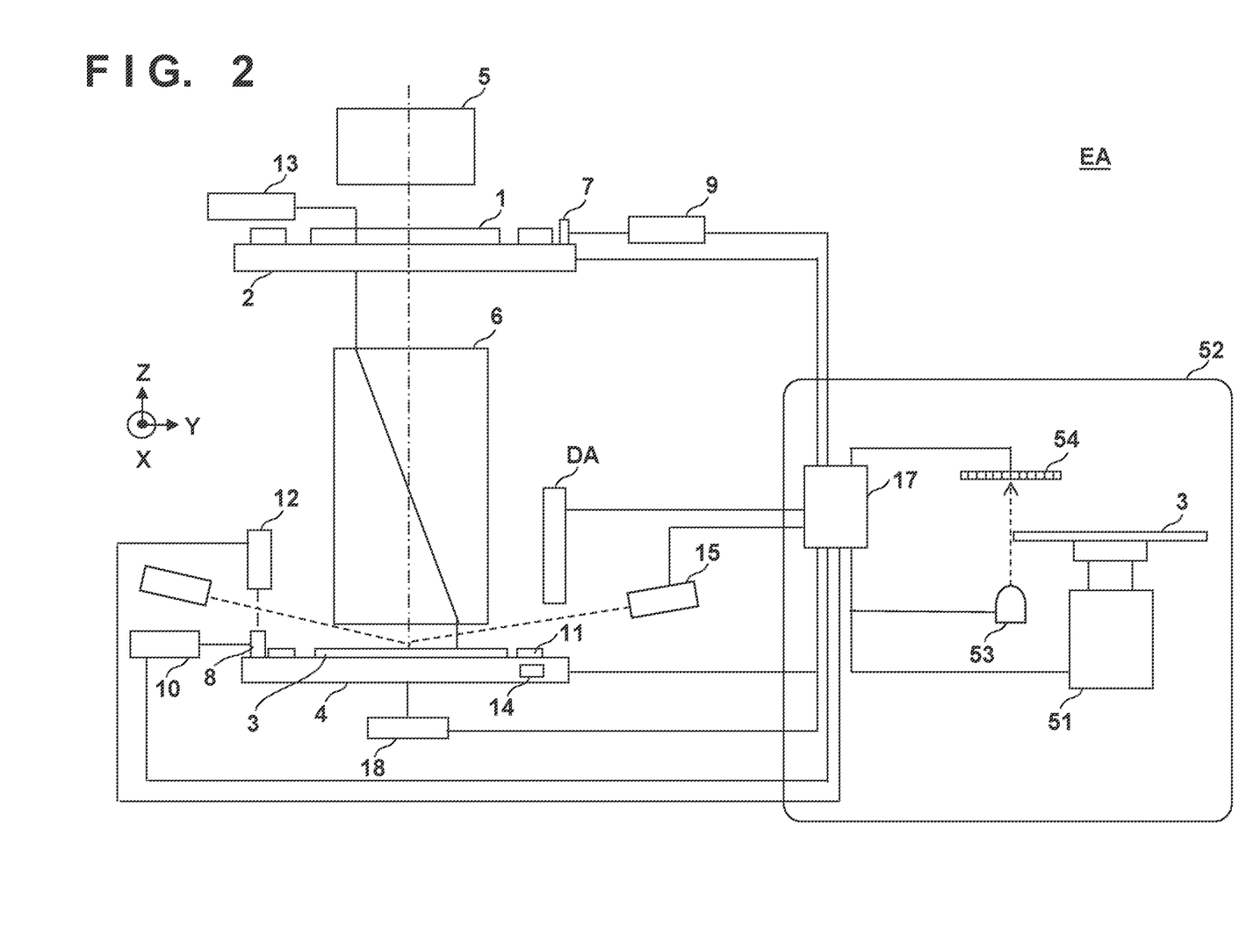
FIG. 2 is a view showing the arrangement of an exposure apparatus according to the embodiment.

FIG. 1 schematically shows the arrangement of a detection apparatus DA according to an embodiment. FIG. 2 schematically shows the arrangement of an exposure apparatus EA according to the embodiment. The exposure apparatus EA can include the detection apparatus DA. The exposure apparatus EA can transfer a pattern of an original 1 to a substrate 3 by projecting the pattern of the original 1 to the substrate 3 such that the substrate 3 is exposed. The exposure apparatus EA can include an original stage 2 that holds the original 1, a substrate stage 4 that holds the substrate 3, an illumination optical system 5 that illuminates the original 1 with exposure light, a projection optical system 6 that projects the pattern of the original 1 to the substrate 3, and a controller 17 that controls respective components of the exposure apparatus EA. The controller 17 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer installed with a program, or a combination of all or some of these components. The controller 17 may be understood as a processor.

The exposure apparatus EA can be formed as, for example, a scanning exposure apparatus (scanning stepper) that transfers the pattern of the original 1 to the substrate 3 while moving the original 1 and the substrate 3 in a scanning direction in synchronization with each other. Alternatively, the exposure apparatus EA can be formed as a stepper that transfers the pattern of the original 1 to the substrate 3 while the original 1 and the substrate 3 remain at rest. In the following description, in order to provide a practical example, an example will be described in which the exposure apparatus EA is formed as a scanning exposure apparatus. In the following description, a direction coincident with the optical axis of the projection optical system 6 will be defined as the Z direction. A direction (scanning direction) in which the original 1 and the substrate 3 are moved in synchronization with each other in a plane perpendicular to the Z direction will be defined as the Y direction. A direction (non-scanning direction) perpendicular to the Z direction and the Y direction will be defined as the X direction. Rotation directions around the X-, Y-, and Z-axes will be defined as the θX, θY, and θZ directions, respectively.

An illuminated region of the original 1 is illuminated with exposure light having a uniform illuminance distribution by the illumination optical system 5. The illumination optical system 5 can be, for example, a mercury lamp, an excimer laser such as a KrF excimer laser or an ArF excimer laser, or an EUV light source that generates extreme ultraviolet light (EUV light) having a wavelength of several nm to several hundred nm. The original stage 2 can two-dimensionally move in a plane perpendicular to the optical axis of the projection optical system 6, that is, in the X-Y plane and finely rotate in the θZ direction while holding the original 1. The original stage 2 can be driven by, for example, an original stage driving device (not shown) such as a linear motor, and the original stage driving device can be controlled by the controller 17. The original stage 2 can be provided with an original stage mirror 7. A laser interferometer 9 for measuring the position of the original stage 2 can be provided at a position facing the original stage mirror 7. The laser interferometer 9 measures in real time the two-dimensional position and rotation angle of the original 1 held by the original stage 2, and provides the measurement result to the controller 17. The controller 17 operates the original stage driving device based on the measurement result of the laser interferometer 9, thereby positioning the original 1 held by the original stage 2.

The projection optical system 6 can project the pattern of the original 1 to the substrate 3 at a predetermined projection magnification β. The projection optical system 6 can be formed from a plurality of optical elements. The projection magnification β can be, for example, 1, ½, ¼, or ⅕, but is not limited thereto.

The substrate stage 4 can include, for example, a substrate chuck that holds the substrate 3, a Z stage that holds the substrate chuck, an X-Y stage that supports the Z stage, and a base that supports the X-Y stage. The substrate stage 4 can be driven by a substrate stage driving mechanism 18 such as a linear motor. The substrate stage driving mechanism 18 can be controlled by the controller 17. The substrate stage 4 can be provided with a substrate stage mirror 8 that moves together with the substrate stage 4. Further, laser interferometers 10 and 12 (an X-direction laser interferometer is not shown) each for measuring the position of the substrate stage 4 can be provided at positions facing the substrate stage mirror 8. The X- and Y-direction positions and θZ of the substrate stage 4 can be measured by a multi-axis laser interferometer in real time, and the measurement result can be provided to the controller 17. The Z-direction position, θX, and θY of the substrate stage 4 can be measured by a multi-axis laser interferometer in real time, and the measurement result can be provided to the controller 17. The controller 17 operates the substrate stage driving mechanism 18 based on the measurement results of the laser interferometers, thereby positioning the substrate 3 held by the substrate stage 4.

Figure 3:
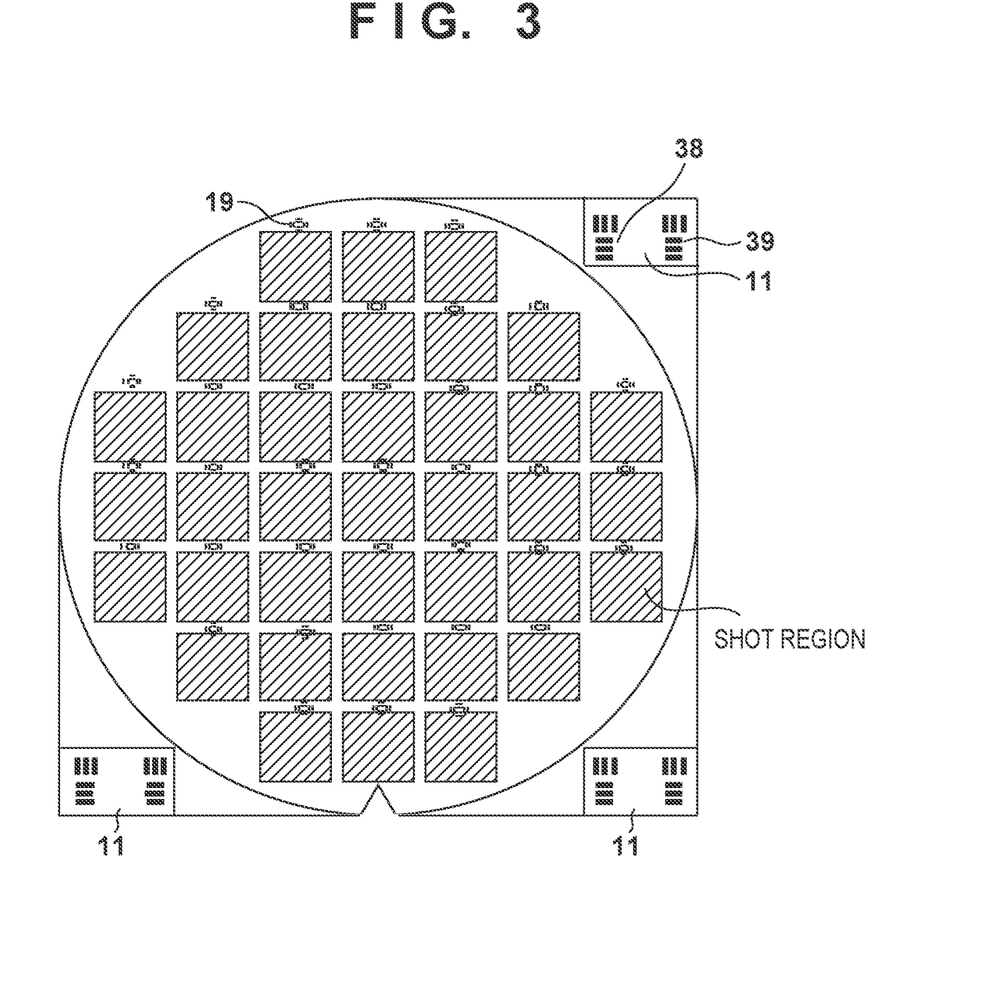
FIG. 3 is a view illustrating the arrangement of a stage reference plate.

A stage reference plate 11 can be installed at one corner of the substrate stage 4 to be almost flush with the surface of the substrate 3. FIG. 3 shows a detailed arrangement example of the stage reference plate 11. The stage reference plate 11 includes an alignment reference mark 39 that is detected by the detection apparatus DA, and an alignment reference mark 38 that is detected by an original alignment detection system 13 or an original alignment detection system 14. One stage reference plate 11 can be arranged at each of a plurality of corners of the substrate stage 4. One stage reference plate 11 may include a plurality of the alignment reference marks 38 and a plurality of the alignment reference marks 39. The positional relationship (X and Y directions) between the alignment reference mark 38 and the alignment reference mark 39 is known. The alignment reference mark 38 and the alignment reference mark 39 may be common.

The original alignment detection system 13 can be provided near the original stage 2. For example, the original alignment detection system 13 can detect the relative position between the original reference mark (not shown) of the original 1 and the alignment reference mark 38 through the projection optical system 6 using light having the same wavelength as the exposure light that exposes the substrate 3. At this time, by detecting the relative position between the original reference mark of the original 1 and the alignment reference mark 38 of the stage reference plate 11 for each of the X- and Y-direction positions and the focus (Z-direction position), the relative positional relationship (X, Y, and Z) between the original 1 and the substrate 3 can be obtained.

The alignment reference mark 38 that is detected by the original alignment detection system 13 can be a reflective mark. Alternatively, the alignment reference mark 38 may be a transmission mark. In this case, the transmission alignment detection system 14 can be used to perform detection. Light (light having the same wavelength as the exposure light) from the illumination optical system 5 can enter the transmission alignment detection system 14 via an original reference mark (not shown), the projection optical system 6, and the alignment reference mark 38. The transmission alignment detection system 14 can include a light amount sensor that detects the amount of light entering it. By detecting the light amount using the light amount sensor while driving the substrate stage 4 in the X, Y, and Z directions, the relative positional relationship (X, Y, and Z) between the original 1 and the substrate 3 can be obtained.

A focus detection system 15 includes, for example, a light projecting system that obliquely projects detection light to the surface of the substrate 3, and a light receiving system that receives reflected light from the substrate 3. The focus detection system 15 can detect the position (Z-direction position) of the surface of the substrate 3 based on the position where the light receiving system receives the reflected light. The detection result of the focus detection system 15 can be provided to the controller 17. By moving the Z stage of the substrate stage 4 based on the detection result of the focus detection system 15, the controller 17 can control the position (focus position) in the Z-axis direction and the inclination angle of the substrate 3.

The detection apparatus DA can be used to detect the position of an alignment mark 19 of the substrate 3 or the position of the alignment reference mark 39 of the stage reference plate 11. The detection apparatus DA can also be used to detect the orientation indicated by the orientation reference of the substrate 3. Here, the detection apparatus for detecting the position of the alignment mark 19 of the substrate 3 or the position of the alignment reference mark 39 of the stage reference plate 11 and the detection apparatus for detecting the orientation indicated by the orientation reference of the substrate 3 may be separately provided. The detection apparatus DA is connected to the controller 17, and the detection result of a position the detection apparatus DA can be provided to the controller 17. By moving the substrate stage 4 based on the detection result of the detection apparatus DA, the controller 17 can control the position of the substrate 3 held by the substrate stage 4.

FIG. 1 schematically shows how the detection apparatus DA detects the position of the alignment mark 19 of the substrate 3. An alignment measurement light source 20 can be a light source that generates alignment measurement light including, for example, light of a first wavelength range (for example, 550 nm to 700 nm), light of a second wavelength range (for example, 450 nm to 550 nm), and light of a third wavelength range (for example, 700 nm to 1500 nm). Light from the alignment measurement light source 20 passes through a first condenser optical system 21, a wavelength filter plate 22, and a second condenser optical system 23, and arrives at an illumination aperture stop 24 arranged on the pupil plane (the optical Fourier transform plane with respect to the object plane) of the detection apparatus DA.

A plurality of filters different in transmission wavelength band are arranged in the wavelength filter plate 22. When one of the plurality of filters is selected in accordance with an instruction from the controller 17 and arranged in the optical path, the wavelength of light for detecting the position of the alignment mark 19 of the substrate 3 can be selected. In an example, the plurality of filters can include a first filter that transmits light of the first wavelength range (for example, 550 nm to 700 nm), a second filter that transmits light of the second wavelength range (for example, 450 nm to 550 nm), and a third filter that transmits light of the third wavelength range (for example, 700 nm to 1500 nm). In the illumination aperture stop 24, a plurality of stops different in illumination a can be arranged. When one of the plurality of stops is selected in accordance with an instruction from the controller 17 and arranged in the optical path, the illumination a for detecting the position of the alignment mark 19 of the substrate 3 can be selected.

The alignment measurement light having arrived at the illumination aperture stop 24 passes through a second illumination optical system 25 and a third illumination optical system 26, and enters a polarizing beam splitter 27. The polarizing beam splitter 27 reflects S-polarized light (polarized light perpendicular to the paper surface of the drawing) of the alignment measurement light. The S-polarized light passes through an NA stop 28 and a prism 29, is converted into circularly polarized light by a λ/4 plate 30, passes through an objective lens 31, and illuminates the alignment mark 19 of the substrate 3. The illumination light that illuminates the alignment mark 19 is shown by a solid line in FIG. 1. The NA of the NA stop 28 can be changed by changing the aperture value. The aperture value of the NA stop 28 can be changed by an instruction from the controller 17.

Light beams (indicated by alternate long and short dashed lines in FIG. 1) reflected, diffracted, and scattered by the alignment mark 19 pass through the objective lens 31 again, are converted into P-polarized light (polarized light parallel to the paper surface of the drawing) by the λ/4 plate 30, and are transmitted through the polarizing beam splitter 27. The light transmitted through the polarizing beam splitter 27 passes through a relay lens 32, a first imaging optical system 33, a detection aperture stop 34, a second imaging optical system 35, and an optical member 36, and enters a photoelectric conversion device 37 (for example, CCD sensor). The photoelectric conversion device 37 can be controlled such that it receives light from the alignment mark 19 but extends the accumulation time until the amount of received light exceeds a certain threshold value. The accumulation time of the photoelectric conversion device 37 can be controlled by the controller 17.

When the detection apparatus DA observes the alignment mark 19 of the substrate 3, due to a transparent layer (for example, a resist) arranged on the alignment mark 19, monochromatic light or light of a narrow wavelength band generates interference fringes. Therefore, an alignment signal with a signal of the interference fringes added thereto is detected. In this case, the position of the alignment mark 19 cannot be detected with high accuracy. Accordingly, in order to prevent generation of the interference fringes, a light source that generates light of a wide wavelength band is generally advantageous as the alignment measurement light source 20. A signal with less interference fringes added thereto is detected. Note that a detection apparatus formed as an off-axis detection apparatus has been illustrated here as the detection apparatus DA, but the detection apparatus DA may be formed as an TTL detection apparatus that detects the alignment mark via the projection optical system 6.

The components 20 to 37 described above can form an alignment mark detection system (first detection system) 70. The components 21 to 31 can form an illumination optical system that illuminates the substrate 3 (or alignment mark 19) as an object to be detected. The components 27 to 36 can form an imaging optical system that forms an image of the substrate 3 (or the alignment mark 19) on the incident plane of the photoelectric conversion device 37. The illumination optical system and the imaging optical system can share the components 27 to 31.

Figure 4:
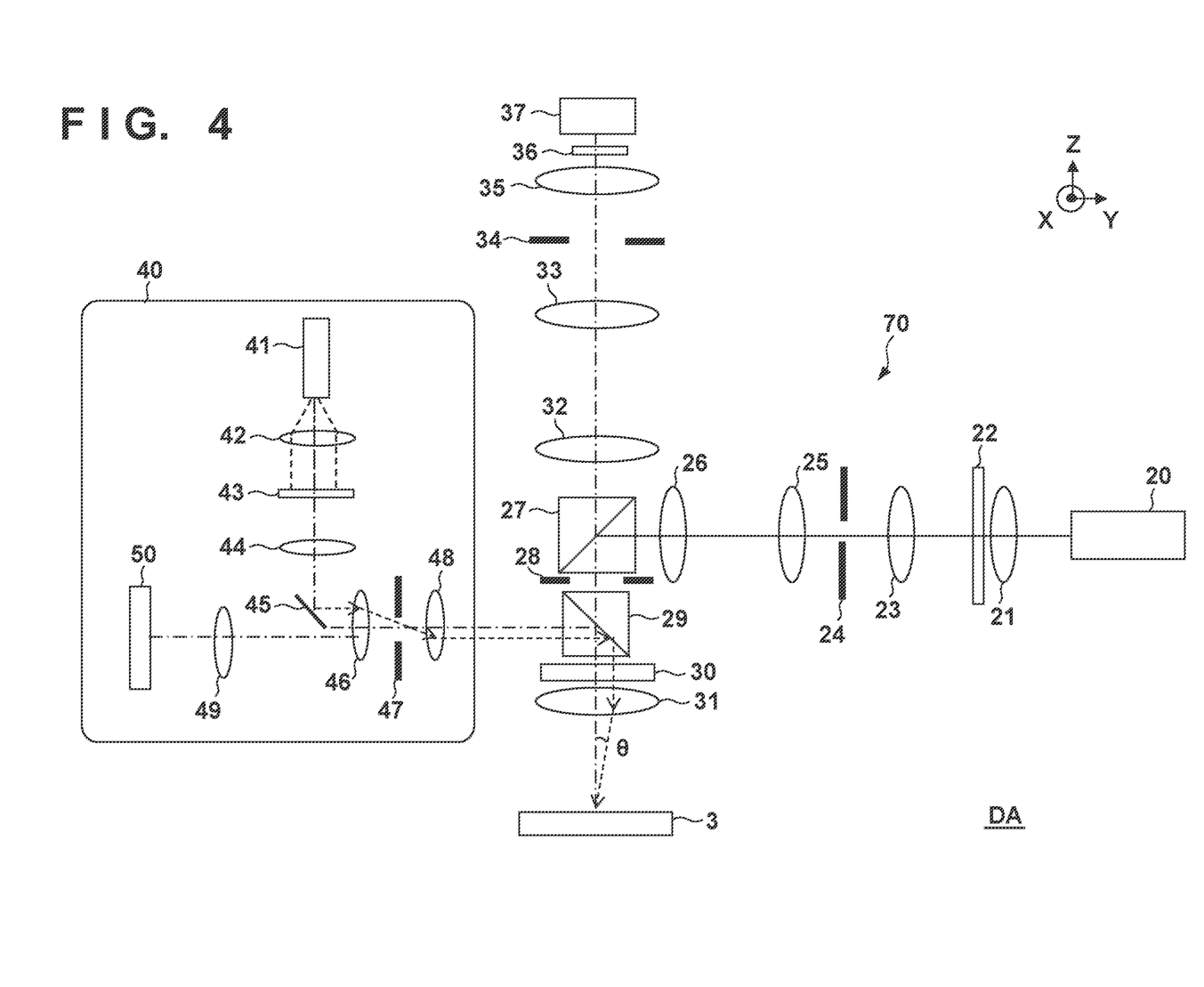
FIG. 4 is a view for explaining the detection apparatus according to the embodiment.
Figure 5:
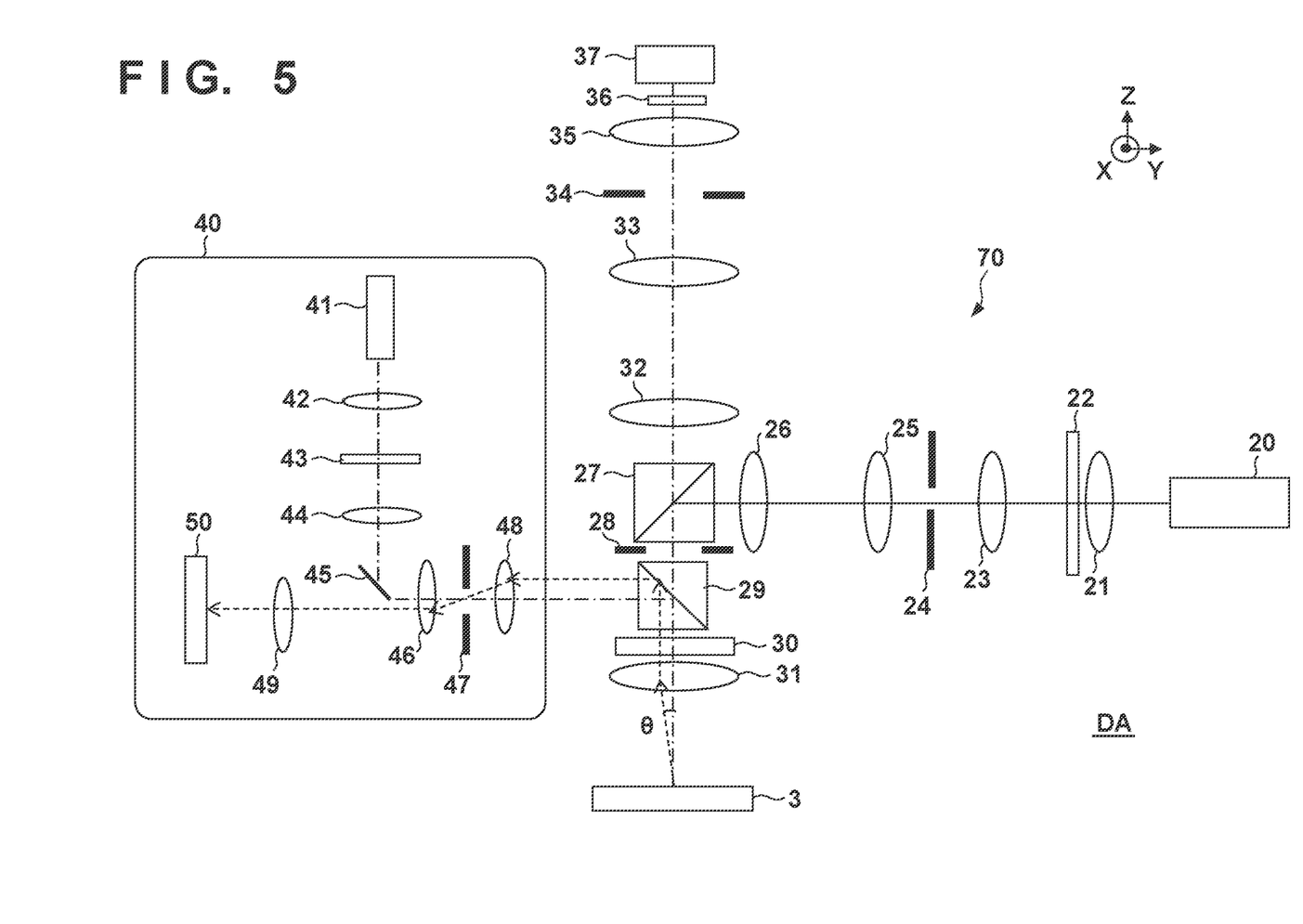
FIG. 5 is a view for explaining the detection apparatus according to the embodiment.

Each of FIGS. 4 and 5 schematically shows focus detection by the detection apparatus DA. The detection apparatus DA can include a focus detection system (second detection system) 40. The alignment detection system (first detection system) 70 and the focus detection system (second detection system) 40 can share the optical system formed from the components 29 to 31. For the sake of convenience, FIG. 4 shows the focus measurement light that irradiates the substrate 3, and FIG. 5 shows the focus measurement light reflected by the substrate 3.

A description will be given with reference to FIG. 4. The focus measurement light from a focus measurement light source 41 can Koehler-illuminate a focus measurement pattern 43 via a lens 42. The focus measurement light source 41 can generate the focus measurement light having a wavelength different from the wavelength of the alignment measurement light. The focus measurement pattern 43 can be formed by, for example, drawing a slit pattern in a glass substrate. The focus measurement light transmitted through the pattern drawn in the center portion of the focus measurement pattern 43 passes through a lens 44, is reflected by a mirror 45, and arrives at a lens 46. Although only the principal ray of the focus measurement light after passing through the focus measurement pattern 43 is shown in FIG. 4 for the sake of simplicity, it has a given NA in practice. The focus measurement light enters not the center of the lens 46 but a portion decentered from the center of the lens 46, and is refracted by the lens 46, thereby passing through a reference mirror 47, and entering a lens 48. As for the lens 48 as well, the focus measurement light enters not the center of the lens 48 but a portion decentered from the center of the lens 48. The focus measurement light refracted by the lens 48 enters the prism 29. The prism 29 has a property of reflecting the focus measurement light but transmitting the alignment measurement light. The focus measurement light reflected by the prism 29 is transmitted through the λ/4 plate 30 and enters the objective lens 31. The focus measurement light enters not the center of the objective lens 31 but a portion decentered from the center of the objective lens 31, and is refracted by the objective lens 31, thereby obliquely entering the substrate 3 at an angle θ (an angle with respect to the normal of the surface of the substrate 3) as shown in FIG. 4. Thus, the focus measurement patter 43 is projected to the substrate 3.

A description will be given with reference to FIG. 5. Although only the principal ray of the focus measurement light is shown in FIG. 5 for the sake of simplicity, the focus measurement light has a given NA in practice. The focus measurement light reflected by the substrate 3 is reflected by the substrate 3 at the angle θ, and enters the objective lens 31. The focus measurement light enters not the center of the objective lens 31 but a portion decentered from the center of the objective lens 31, and is refracted by the objective lens 31, thereby being transmitted through the λ/4 plate 30 and entering the prism 29. The focus measurement light reflected by the prism 29 enters the lens 48. The focus measurement light enters not the center of the lens 48 but a portion decentered from the center of the lens 48, and is refracted by the lens 48, thereby passing through the reference mirror 47 and entering the lens 46. The focus measurement light enters not the center of the lens 46 but a portion decentered from the center of the lens 46, and is refracted by the lens 46, thereby entering a lens 49, being transmitted through a lens 49, and entering the incident plane of a photoelectric conversion device 50.

Here, if the surface of the substrate 3 matches the focus plane of the focus detection system 40, the focus measurement light enters the center of the lens 49, is transmitted through the lens 49, enters the center of the incident plane of the photoelectric conversion device 50, and forms an image of the focus measurement pattern 43 on the incident plane. On the other hand, if the surface of the substrate 3 is deviated from the focus plane of the focus detection system 40, the position of the focus measurement light entering the incident plane of the photoelectric conversion device 50 becomes a position corresponding to the direction and amount of the deviation. Therefore, it is possible to measure the deviation amount (that is, defocus amount) of the surface of the substrate 3 from the focus plane of the focus detection system 40 based on the position of the image of the focus measurement pattern 43 formed on the incident plane of the photoelectric conversion device 50. Calculation of the defocus amount based on the position of the image of the focus measurement pattern 43 formed on the incident plane of the photoelectric conversion device 50 can be performed by the controller 17.

The description will be continued with reference to FIG. 2. The position and orientation (θZ direction) of the substrate 3 to be conveyed to the substrate stage 4 can be prealigned to a predetermined position and a predetermined orientation, respectively, in a prealignment apparatus 52. The prealignment apparatus 52 may be a part of the exposure apparatus EA, or may be an apparatus different from the exposure apparatus EA. The prealignment apparatus 52 can include a prealignment stage 51. The prealignment stage 51 can have a function of holding the substrate 3 and positioning the substrate 3 in the X and Y directions and the θZ direction.

Figure 6A:
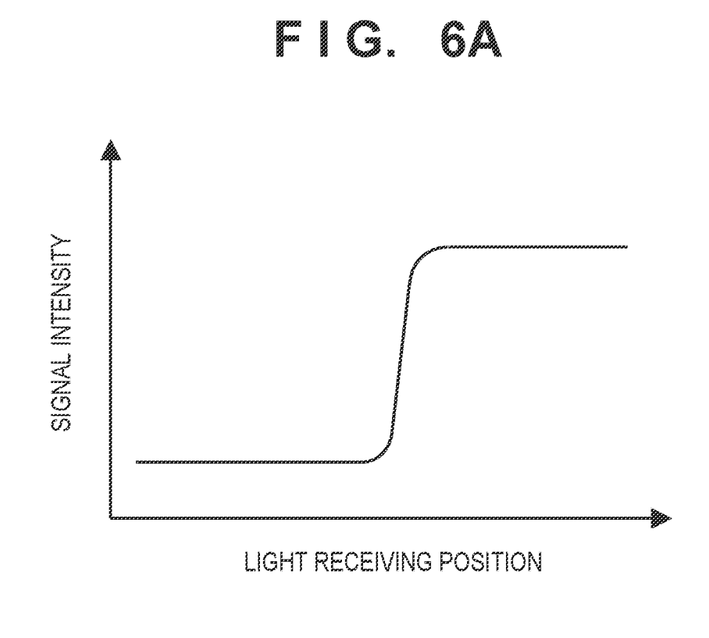
FIGS. 6A and 6B are graphs each illustrating an output signal of a light receiver of a prealignment apparatus.
Figure 6B:
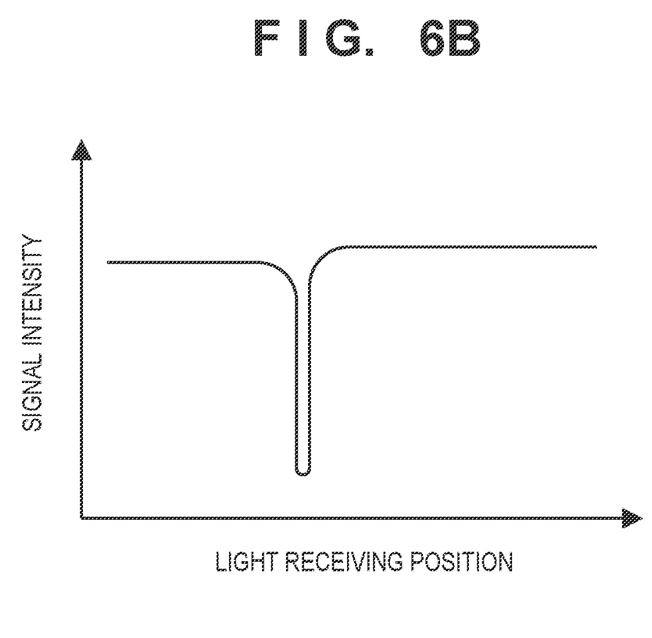

The prealignment apparatus 52 includes an alignment sensor for detecting the alignment state of the substrate 3 in the X and Y directions and the θZ direction. The alignment sensor can include, for example, a light projector 53 and a light receiver 54 (for example, a liner image sensor). Part of the measurement light emitted from the light projector 53 is blocked by the substrate 3, and the other part thereof can enter the light receiver 54. Therefore, it is possible to detect the edge position of the substrate 3 based on the light receiving result of the light receiver 54. Each of FIGS. 6A and 6B illustrates an output signal of the light receiver 54. In each of FIGS. 6A and 6B, the abscissa represents the light receiving position on the light receiving plane of the light receiver 54, and the ordinate represents an output value (the intensity of incident measurement light) at each light receiving position of the light receiver 54.

FIG. 6A illustrates the output signal of the light receiver 54 upon prealigning an opaque substrate. Since the measurement light is blocked by the opaque substrate, a shadow of the opaque substrate is formed on the light receiving plane of the light receiver 54. The portion where the intensity of the incident measurement light changes on the light receiving plane indicates the edge of the opaque substrate. Accordingly, based on a change in edge position detected by the light receiver 54 when the opaque substrate is rotated once, it is possible to detect the center position of the opaque substrate and the orientation indicated by the orientation reference of the opaque substrate.

FIG. 6B illustrates the output signal of the light receiver 54 upon prealigning a transparent substrate with a light-shielding film such as a metal film (for example, a Cr film or the like) provided in the outer peripheral portion or a transparent substrate including a chamfer in the outer peripheral portion. When such a transparent substrate is prealigned, since the output signal of the light receiver 54 decreases at a position corresponding to the outer peripheral portion of the transparent substrate, so that it is possible to detect an edge of the transparent substrate. Accordingly, as for such a transparent substrate as well, based on a change in edge position detected by the light receiver 54 when the substrate is rotated once, it is possible to detect the center position of the substrate and the orientation indicated by the orientation reference of the substrate.

Figure 7:
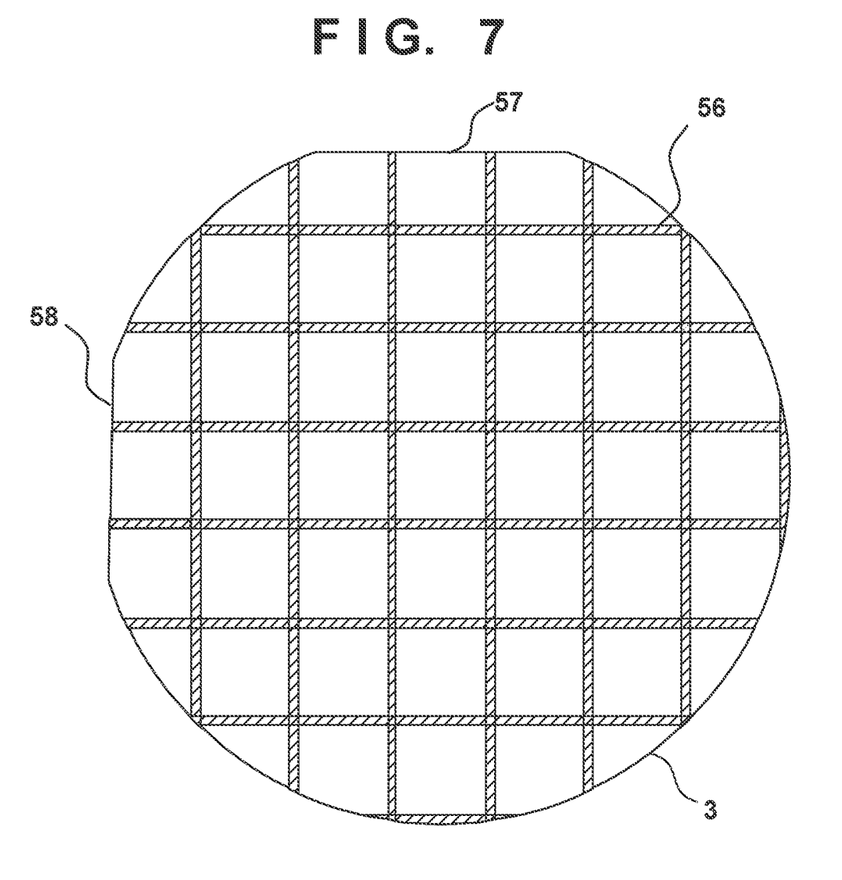
FIG. 7 is a view schematically showing a transparent substrate.
Figure 8:
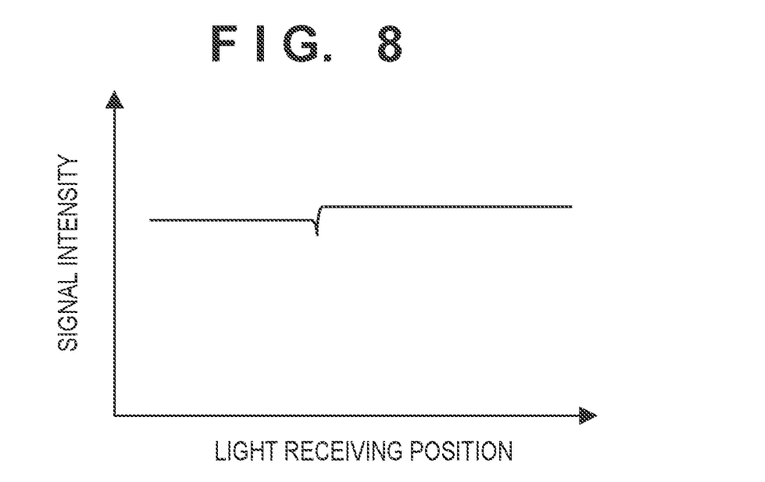
FIG. 8 is a graph illustrating an output signal of the light receiver of the prealignment apparatus in a case in which the orientation flat of a transparent substrate including the orientation flat with no chamfer is detected.

There is a substrate that is provided with neither a light-shielding film nor a chamfer even though the substrate is transparent. An example of such a substrate can be the substrate 3 schematically shown in FIG. 7. The substrate 3 includes neither a light-shielding film nor a chamfer. The substrate 3 can include, as the orientation reference, a straight notch portion (orientation flat) 57 formed along a crystal lattice 56 of the substrate 3. There is a case in which a chamfer cannot be provided in the orientation flat 57. In this case, even if it is tried to detect the orientation flat 57, the output signal of the light receiver 54 becomes an output signal with low contrast as illustrated in FIG. 8. If the substrate is aligned with respect to the position (X and Y directions) and the orientation (θZ direction) based on the output signal with low contrast, the crystal orientation of the substrate 3 cannot be accurately matched to a target direction, and the product yield can be lowered.

Figure 9A:
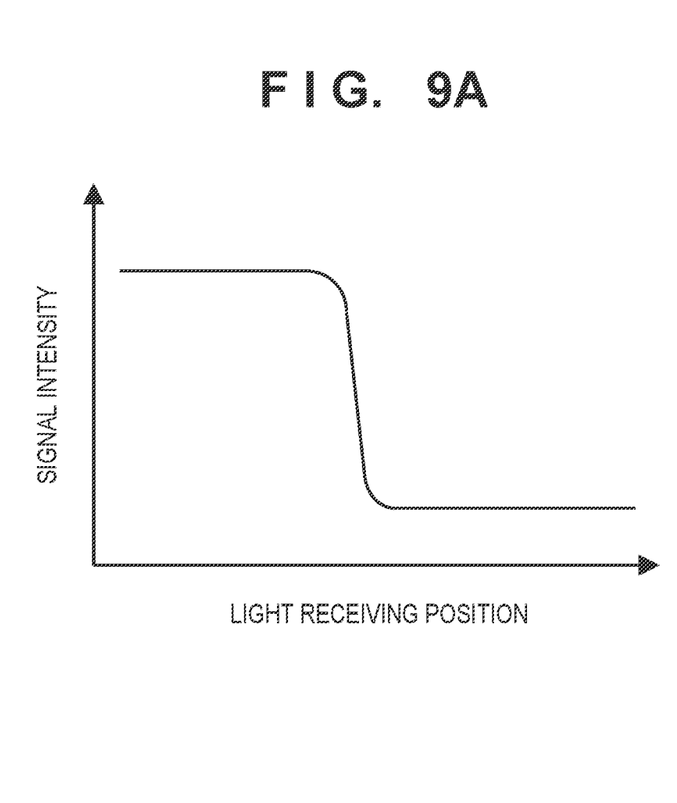
FIGS. 9A and 9B are graphs each illustrating an output signal of a photoelectric conversion device of an alignment detection system.
Figure 9B:
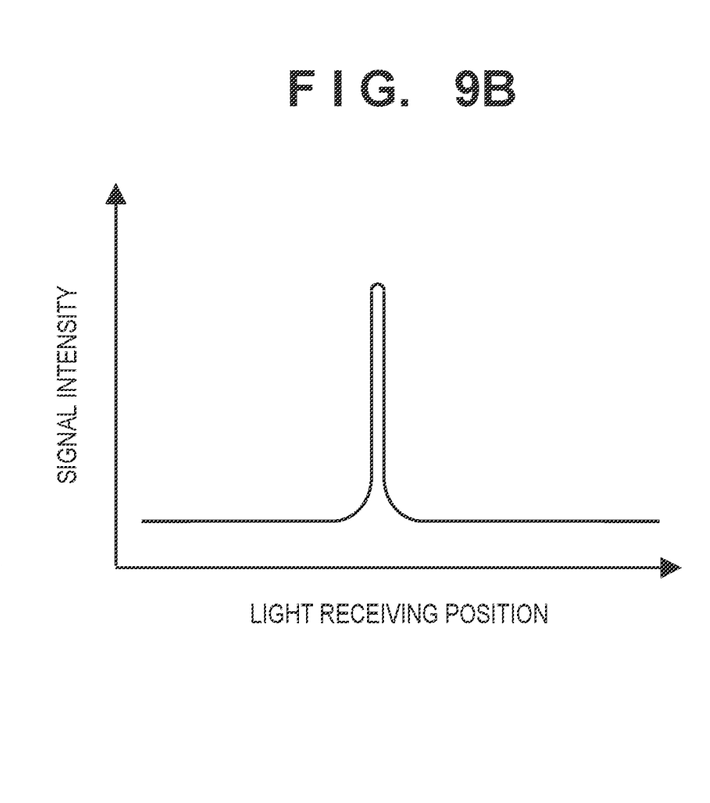

Therefore, in the exposure apparatus EA according to this embodiment, the substrate 3 conveyed from the prealignment apparatus 52 to the exposure apparatus EA undergoes alignment again with respect to the position and the orientation using the detection apparatus DA. In this embodiment, the detection apparatus DA detects an edge of the substrate 3 (and the position and orientation of the substrate 3 based on the edge) by bright-field measurement using the measurement light from the alignment measurement light source 20. In the bright-field measurement, the photoelectric conversion device 37 detects only surface reflected light from the substrate 3. Accordingly, if the substrate 3 matches the focus plane of the detection apparatus DA (alignment detection system thereof), an output signal of the photoelectric conversion device 37 can have high contrast as illustrated in FIG. 9A. Further, the detection apparatus DA may be changed to perform dark-field measurement. In the dark-field measurement, scattered light from the edge of the substrate 3 is detected. In the dark-field measurement, if the substrate 3 matches the focus plane of the detection apparatus DA (alignment detection system thereof), an output signal of the photoelectric conversion device 37 can have high contrast as illustrated in FIG. 9B.

In addition to the orientation flat (to be referred to as the first orientation flat hereinafter) 57, the substrate 3 can include a second orientation flat 58 that is provided with a chamfer but is not along the crystal lattice 56. If such the substrate 3 is used, the prealignment apparatus 52 can perform prealignment using the second orientation flat 58 provided with the chamfer, and the detection apparatus DA can perform detection of the edge (position and orientation) of the substrate 3 using the first orientation flat 57. If the substrate 3 including the second orientation flat 58 alone is used, the prealignment apparatus 52 can perform prealignment using the second orientation flat 58 provided with the chamfer, and the orientation of the crystal lattice of the substrate 3 can be directly measured on the substrate stage 4.

On the other hand, the alignment detection system 70 of the detection device DA tends to have a small depth of focus. Therefore, in order to detect the edge (and position and orientation based on the edge) of the substrate 3 with high accuracy, focus detection should be performed using the focus detection system 40 before detecting the edge, and a focusing operation should be performed based on the result of the focus detection. Accordingly, in this embodiment, the focus detection system 40 detects the position of the surface of the substrate 3 and a focusing operation of the alignment detection system 70 is performed based on the detection result. Thereafter, the alignment detection system 70 detects the orientation reference. The position of the surface of the substrate 3 means the position of the surface in the Z direction perpendicular to the surface. It is preferable that the focus plane of the focus detection system 40 and the focus plane of the alignment detection system 70 match each other, but if the different therebetween is known, they may not match each other.

Figure 10:
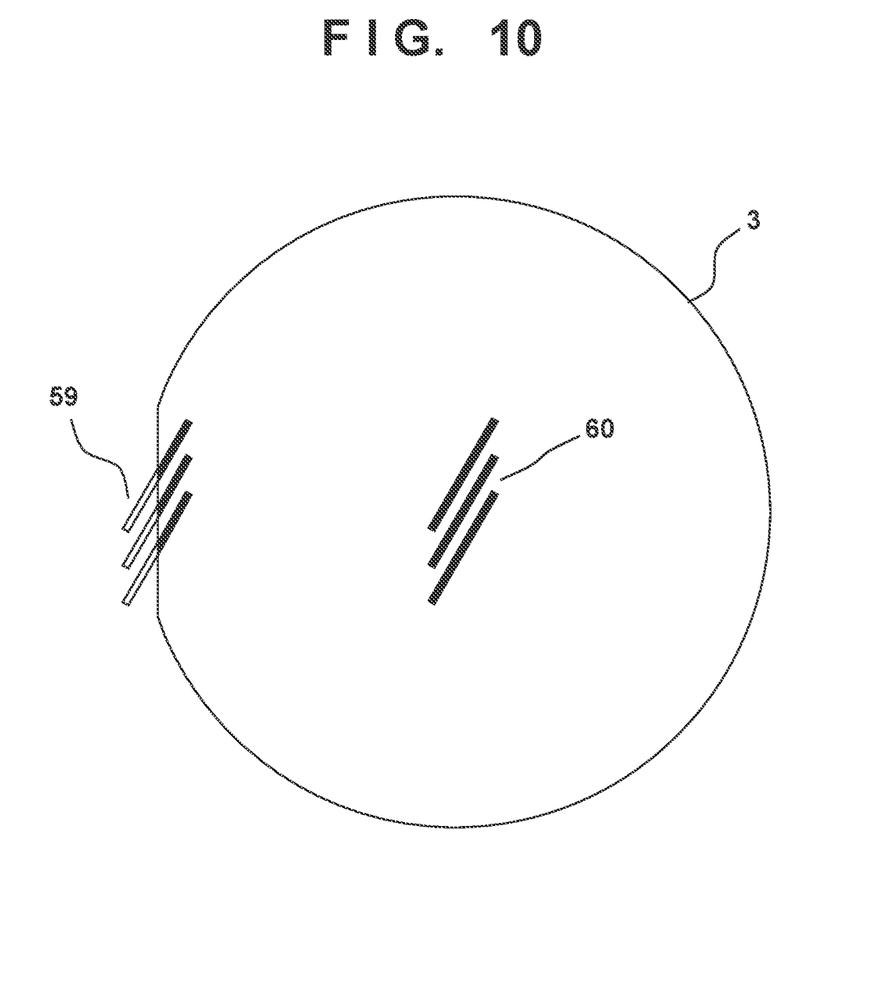
FIG. 10 is a view for explaining an operation of a focus detection system.

Detection of the position of the surface of the substrate 3 by the focus detection system 40 is preferably performed on a region of the surface spaced apart from the edge. The significance will be described with reference to FIG. 10. If the image of the focus measurement pattern 43 projected to the surface of the substrate 3 crosses the edge of the substrate 3 as shown as an image 59, the light amount detected by the photoelectric conversion device 50 is decreased, and this can cause a decrease in detection accuracy of the position of the surface of the substrate 3. Accordingly, as shown as an image 60, the image of the focus measurement pattern 43 projected to the surface of the substrate 3 is preferably formed in a region of the surface of the substrate 3 spaced apart from the edge of the substrate 3. That is, the detection of the position of the surface of the substrate 3 by the focus detection system 40 is preferably performed on a region of the surface spaced apart from the edge to suppress a decrease in detection accuracy of the position of the surface of the substrate 3.

As shown in FIGS. 1, 4, and 5, if detection by the alignment detection system 70 and detection by the focus detection system 40 are performed on the same region, the objective-side optical system of the alignment detection system 70 and the objective-side optical system of the focus detection system 40 can be common. In this case, the focus detection system 40 can first perform detection of the position of the surface of the substrate 3 on a region of the surface of the substrate 3 spaced apart from the edge of the substrate 3. Thereafter, the relative position between the alignment detection system 70 and the substrate stage 4 is changed such that the edge of the substrate 3 enters the field of view of the alignment detection system 70, and the alignment detection system 70 can perform detection of the edge (and position and orientation based on the edge) of the substrate 3. The relative position between the alignment detection system 70 and the substrate stage 4 is changed by driving the substrate stage 4 using the substrate stage driving mechanism 18, but it may be changed by moving the alignment detection system 70. Further, the detection of the position of the surface of the substrate 3 by the focus detection system 40 can be performed by moving the substrate stage 4 in the Z direction, but it may be performed by moving the focus detection system 40 in the Z direction. Alternatively, the detection of the position of the surface of the substrate 3 by the focus detection system 40 may be performed by adjusting the position of a focusing lens provided in the focus detection system 40. In this case, for example, it is possible to detect the position of the surface of the substrate 3 based on the position of the focusing lens. Alternatively, the detection of the position of the surface of the substrate 3 by the focus detection system 40 may be performed based on the position of an image of the focus measurement pattern in an output signal of the photoelectric conversion device 50 without moving the focus detection system 40 and the substrate stage 4.

It is also possible to employ an arrangement in which the alignment detection system 70 and the focus detection system 40 are separated. In such an arrangement, the focus detection system 40 can be arranged such that detection is performed on a region of the surface of the substrate 3 spaced apart from the edge of the substrate 3, and the alignment detection system 70 can be arranged such that detection is performed on a region including the edge of the substrate 3. In this case, it is unnecessary to perform, after the position of the surface of the substrate 3 is detected, an operation of changing the relative position between the alignment detection system 70 and the substrate 3 such that detection is performed on the region including the edge of the substrate 3, so that a time required for measurement can be shortened.

Figure 11:
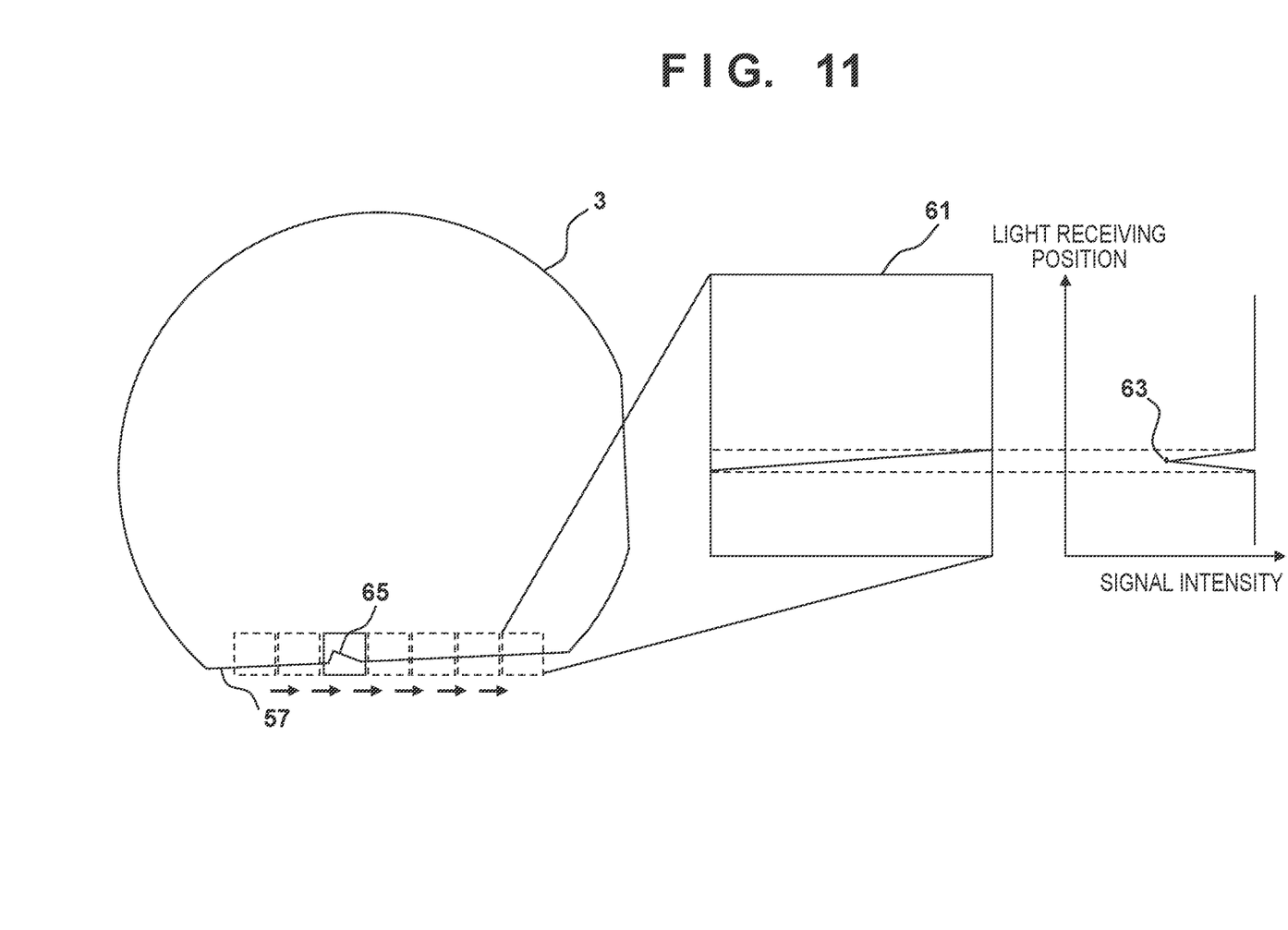
FIG. 11 is a view for explaining an example of detection of the orientation flat by the alignment detection system.

FIG. 11 illustrates a measurement field of view 61 of the alignment detection system. The alignment detection system 70 can detect the position of the edge, that forms the orientation flat 57, of each of a plurality of regions R arranged along the straight portion of the orientation flat 57. For each region R, the controller 17 can calculate, as the signal intensity, a signal obtained by integrating the output signals from the photoelectric conversion device 50 in the tangent direction of the straight portion (edge) of the orientation flat 57, and calculate an extreme value 63 of the signal intensity as the position of the edge of the substrate 3.

Figure 12A:
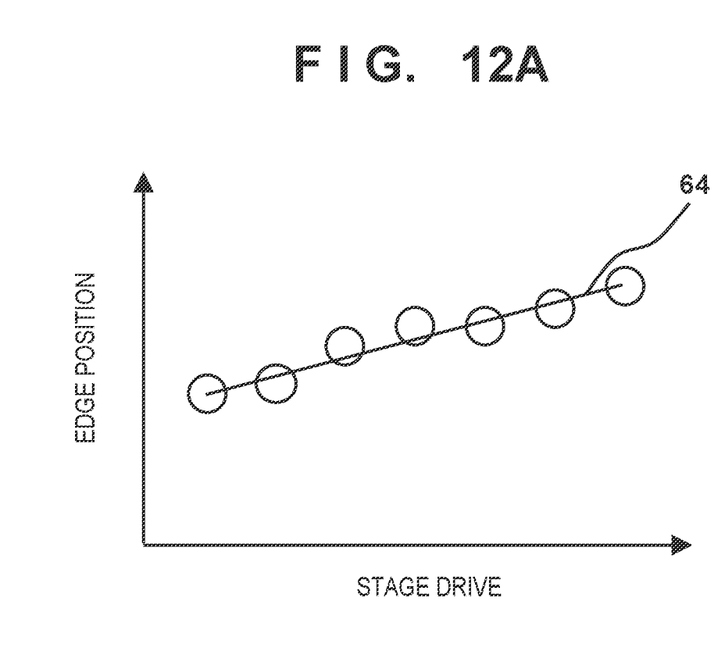
FIGS. 12A and 12B are graphs each illustrating a measurement result of the orientation flat.
Figure 12B:
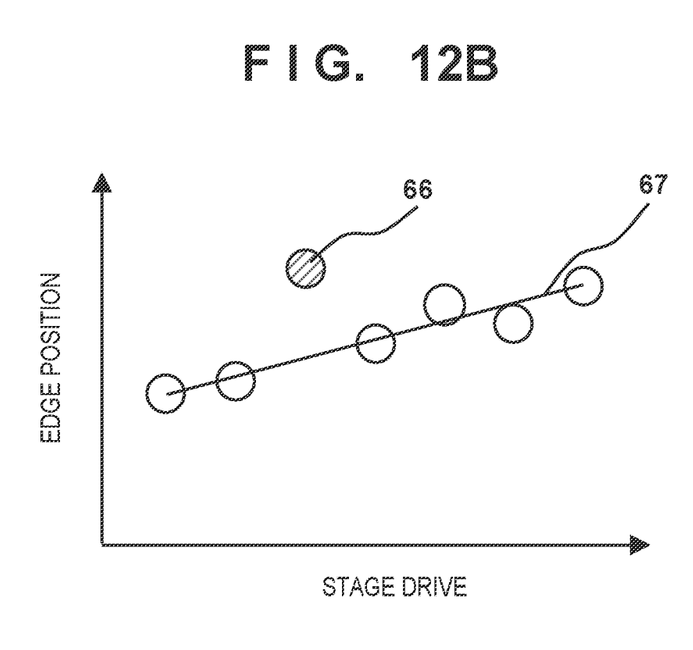

The edge position in each of the plurality of regions R is indicated as in FIG. 12A, and the controller 17 can determine the position of the orientation flat 57 from a linear approximation curve 64 of the results of the edge positions. If a defect 65 exists in the orientation flat 57, the measurement result of the edge position corresponding to the defect 65 becomes an abnormal point 66 as illustrated in FIG. 12B. Then, the controller 17 can calculate the linear approximation curve 64 from the measurement results of the edge portions excluding the abnormal point 66.

Figure 13A:
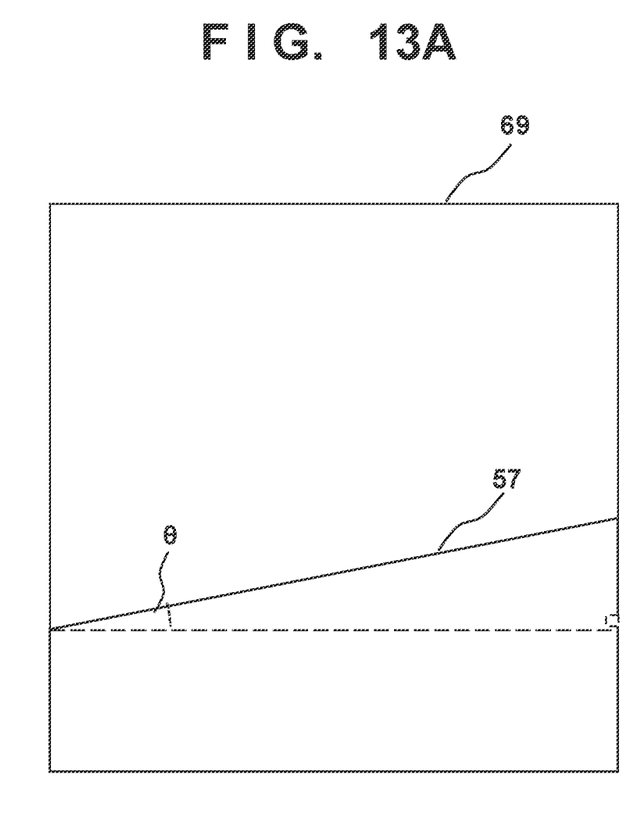
FIGS. 13A and 13B are graphs each illustrating a measurement screen of the edge position of the substrate.
Figure 13B:
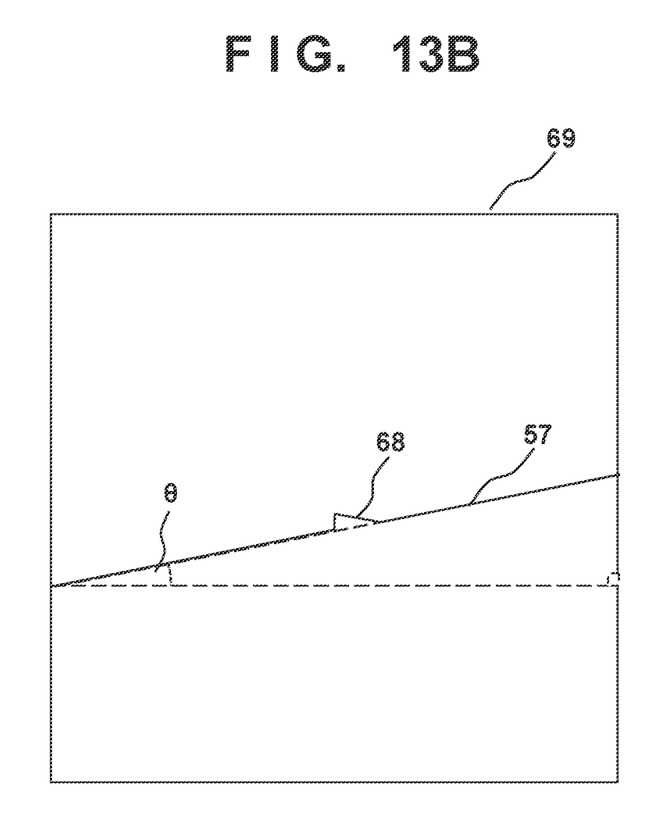

Each of FIGS. 13A and 13B illustrates a measurement screen 69 that shows measurement results of edge positions of the substrate. The measurement screen 69 can be provided to a display (not shown) that can be included in the controller 17. The measurement screen 69 and the substrate stage 4 are compensated for rotation, and an inclination θ in the measurement screen 69 can indicate the deviation of the orientation of the orientation flat from a target direction. If a defect 68 exists in the orientation flat, the linear approximation curve can give the inclination θ.

So far, this embodiment has been described by giving attention to the transparent substrate including neither a light-shielding film nor a chamfer, but this embodiment is also applicable to a substrate including a light-shielding film or a chamfer, and further applicable to an opaque substrate.

An article manufacturing method of manufacturing an article (a semiconductor IC element, a liquid crystal display element, a MEMS, or the like) using the above-described exposure apparatus will be described below. The article can be manufactured using the above-described exposure apparatus through an exposure step of exposing a substrate (a wafer, a glass substrate, or the like) with a photosensitive agent applied thereto, a development step of developing the substrate (photosensitive agent), and a step of processing the developed substrate. The processing step can include etching, resist removal, dicing, bonding, packaging, and the like. According to this article manufacturing method, a higher-quality article than a conventional one can be manufactured.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-043337, filed Mar. 12, 2020, which is hereby incorporated by reference herein in its entirety.

What is claimed is:

1. A detection apparatus that detects an orientation reference of an object to be detected, the object including an edge that includes the orientation reference, the apparatus comprising:
   a first detection system configured to detect the edge such that the orientation reference is detected; and
   a second detection system configured to detect, by projecting a pattern to a surface of the object and detecting an image formed by reflected light from the surface, a position of the surface in a direction perpendicular to the surface,
   wherein the first detection system and the second detection system share an optical system.

2. The apparatus according to claim 1, wherein detection of the position of the surface by the second detection system is performed on a region of the surface, which is spaced apart from the edge.

3. The apparatus according to claim 1, wherein an operation for detecting the position of the surface by the second detection system includes an operation of changing a relative position between the surface and the second detection system in the direction perpendicular to the surface.

4. The apparatus according to claim 1, wherein the first detection system includes a photoelectric conversion device, an illumination optical system configured to illuminate the object, and an imaging optical system configured to form an image of the object on an incident plane of the photoelectric conversion device.

5. The apparatus according to claim 1, wherein the first detection system detects the orientation reference after performing a focusing operation of the first detection system based on the position of the surface detected by the second detection system.

6. The apparatus according to claim 1, wherein:
   the first detection system illuminates the surface with light via the optical system, and
   the second detection system illuminates the surface with light via the optical system.

7. The apparatus according to claim 1, further comprising:
   a driving mechanism configured to drive the object,
   wherein the driving mechanism, after the position of the surface is detected by the second detection system, moves the object such that the orientation reference is detected by the first detection system.

8. The apparatus according to claim 1, wherein the orientation reference is an orientation flat including a straight portion.

9. The apparatus according to claim 8, further comprising a processor configured to obtain, based on a direction of the straight portion detected by the first detection system, an orientation indicated by the orientation reference.

10. The apparatus according to claim 1, wherein the first detection system detects an alignment mark provided on the object in addition to the edge.

11. An exposure apparatus comprising a projection optical system configured to project a pattern of an original to a substrate, which includes an edge including an orientation reference, the apparatus comprising:
   a detection apparatus configured to detect the orientation reference of the substrate; and a substrate stage driving mechanism configured to drive a substrate stage holding the substrate, wherein the detection apparatus includes:
a first detection system configured to detect the edge such that the orientation reference is detected; and
a second detection system configured to detect a position of a surface of the substrate in a direction perpendicular to the surface,
wherein the first detection system and the second detection system share an optical system, and
wherein the substrate stage is driven such that an orientation indicated by the orientation reference detected by the detection apparatus matches a target direction.

12. The apparatus according to claim 11, wherein detection of the position of the surface by the second detection system is performed on a region of the surface, which is spaced apart from the edge.

13. The apparatus according to claim 11, wherein an operation for detecting the position of the surface by the second detection system includes an operation of changing a relative position between the surface and the second detection system in the direction perpendicular to the surface.

14. The apparatus according to claim 11, wherein the second detection system detects the position of the surface by projecting a pattern to the surface and detecting an image formed by reflected light from the surface.

15. The apparatus according to claim 11, wherein after the position of the surface is detected by the second detection system, the substrate stage is driven such that the orientation reference is detected by the first detection system.

16. The apparatus according to claim 11, wherein the first detection system detects an alignment mark provided on the substrate in addition to the edge.

17. The apparatus according to claim 11, further comprising:
a prealignment apparatus configured to prealign the substrate,
wherein the substrate prealigned by the prealignment apparatus is conveyed to the substrate stage.

18. An article manufacturing method comprising:
exposing a substrate by an exposure apparatus defined in claim 11;
developing the substrate exposed in the exposing; and
processing the substrate such that an article is obtained from the substrate developed in the developing.

19. The apparatus according to claim 11, wherein the first detection system detects the orientation reference after performing a focusing operation of the first detection system based on the position of the surface detected by the second detection system.

* * * * *